United States Patent
Seal et al.

(10) Patent No.: US 12,224,233 B2
(45) Date of Patent: Feb. 11, 2025

(54) PACKAGED ELECTRONIC DEVICES HAVING DIELECTRIC SUBSTRATES WITH THERMALLY CONDUCTIVE ADHESIVE LAYERS

(71) Applicant: Wolfspeed, Inc., Durham, NC (US)

(72) Inventors: Sayan Seal, Fayetteville, AR (US);
Kuldeep Saxena, Sewickley, PA (US);
Devarajan Balaraman, Apex, NC (US)

(73) Assignee: Wolfspeed, Inc., Durham, NC (US)

( * ) Notice: Subject to any disclaimer, the term of this patent is extended or adjusted under 35 U.S.C. 154(b) by 195 days.

(21) Appl. No.: 17/159,925

(22) Filed: Jan. 27, 2021

(65) Prior Publication Data

US 2022/0238426 A1 Jul. 28, 2022

(51) Int. Cl.
*H01L 23/498* (2006.01)
*H01L 23/31* (2006.01)

(52) U.S. Cl.
CPC .... *H01L 23/49838* (2013.01); *H01L 23/3121* (2013.01); *H01L 23/49811* (2013.01); *H01L 23/49861* (2013.01)

(58) Field of Classification Search
CPC ......... H01L 23/49838; H01L 23/49861; H01L 23/49562
See application file for complete search history.

(56) References Cited

U.S. PATENT DOCUMENTS

| | | | |
|---|---|---|---|
| 6,160,710 A * | 12/2000 | Ahl | H05K 1/0204 257/E23.084 |
| 10,074,590 B1 * | 9/2018 | Pavier | H01L 24/48 |
| 2003/0011054 A1 | 1/2003 | Jeun et al. | |
| 2004/0061206 A1 | 4/2004 | Son et al. | |
| 2006/0056213 A1 | 3/2006 | Lee et al. | |
| 2013/0200502 A1 * | 8/2013 | Nikitin | H01L 24/92 257/E23.117 |

(Continued)

FOREIGN PATENT DOCUMENTS

| JP | 56048160 A | * | 5/1981 |
|---|---|---|---|
| JP | S5648160 A | | 5/1981 |

(Continued)

OTHER PUBLICATIONS

"Data Sheet for Infineon IKFW50N60DH3E" available at https://www.digikey.com/en/products/detail/IKFW50N60DH3EXKSA1/IKFW50N60DH3EXKSA1-ND/8130837?utm_medium=email&utm_source=oce&utm_campaign=3480_OCE20RT&utm_content=productdetail_US&utm_cid=1579008&so=66893821&mkt_tok=eyJpljoiT1RVeU9UUTVaRFF3TIRFNSIsInQiOiJjRIdickxLamZsdHpmQ0xZNkxxR2tuNUM3UEIkbDI1RWF4alZVSWpZSWxmUmVKcmtFNnZzK09seU1waU4wdWpRWIFCaWxiUGR1WkFLb3JiVWxrKWXhQ "TrenchStop Advanced Isoltaion" (2017): pp. 1-16.

(Continued)

*Primary Examiner* — Michele Fan
(74) *Attorney, Agent, or Firm* — Myers Bigel, P.A.

(57) ABSTRACT

A packaged electronic device comprises a power semiconductor die that comprises a first terminal and a second terminal, a lead frame comprising a lower side and an upper side that comprises a die pad region, a first lead and a second lead, wherein the first lead is integral with the lead frame and electrically connected to the first terminal of the power semiconductor die through the lead frame, a dielectric substrate, and a thermally conductive adhesion layer on an upper side of the dielectric substrate. The power semiconductor die is on the die pad region of the lead frame and the lead frame is on an upper side of the thermally conductive adhesion layer.

17 Claims, 6 Drawing Sheets

(56) References Cited

U.S. PATENT DOCUMENTS

| | | | | |
|---|---|---|---|---|
| 2014/0002989 A1* | 1/2014 | Ahuja | ............... | H01L 25/50 |
| | | | | 361/679.54 |
| 2017/0053852 A1 | 2/2017 | Oi et al. | | |
| 2021/0225734 A1* | 7/2021 | Fuergut | ............... | H01L 25/072 |

FOREIGN PATENT DOCUMENTS

| | | | | | |
|---|---|---|---|---|---|
| JP | H0567697 | A | | 3/1993 | |
| JP | 07312380 | A | * | 11/1995 | ............. H01L 24/82 |
| JP | 2013122993 | A | | 6/2013 | |
| JP | 2014096432 | A | | 5/2014 | |

OTHER PUBLICATIONS

"Notification of Transmittal of the International Search Report and the Written Opinion of the International Searching Authority, or the Declaration for corresponding International Application No. PCT/US2022/011749, mailing date: Apr. 28, 22, (14 pages)".

* cited by examiner

PACKAGED ELECTRONIC DEVICES HAVING DIELECTRIC SUBSTRATES WITH THERMALLY CONDUCTIVE ADHESIVE LAYERS

FIELD OF THE INVENTION

The present invention relates to packaged electronic devices and, more particularly, to techniques for isolating the power semiconductor die(s) in such devices from the primary thermal interface of the device package.

BACKGROUND

Power semiconductor devices refer to devices that include one or more semiconductor die that are designed to carry large currents (e.g., tens or hundreds of Amps) and/or that are capable of blocking high voltages (e.g., hundreds, thousand or tens of thousands of volts). Power semiconductor die are often fabricated from wide band-gap semiconductor materials, such as silicon carbide ("SiC") or gallium nitride ("GaN") based semiconductor materials. Power semiconductor die are often packaged to provide a packaged electronic device. A wide variety of packaged electronic devices are known in the art, including Metal Oxide Semiconductor Field Effect Transistors ("MOSFETs"), Metal Insulator Semiconductor Field Effect Transistors ("MISFETs"), insulated gate bipolar junction transistors ("IGBTs"), Schottky diodes, and the like.

Power MOSFETs are one widely used packaged electronic device. A power MOSFET is a three terminal device that has gate, drain and source terminals and a semiconductor layer structure that is often referred to as a semiconductor body. A source region and a drain region that are separated by a channel region are formed in the semiconductor body, and a gate electrode (which may act as the gate terminal or be electrically connected to the gate terminal) is disposed adjacent the channel region. The MOSFET may be turned on (to conduct current through the channel region between the source region and drain regions) by applying a bias voltage to the gate electrode, and may be turned off (to block current flow through the channel region) by removing the bias voltage (or reducing the bias voltage below a threshold level).

Both discrete and multichip power packaged electronic devices are commercially available. Discrete power packaged electronic devices refer to packaged power semiconductor modules that include a single power semiconductor die, such as packaged MOSFETs, Schottky diodes, IGBTs and the like. Multichip power packaged electronic devices refer to power semiconductor modules that include two or more power semiconductor dies that are provided (and typically interconnected) within a common package. Discrete power packaged electronic devices comprise a large segment of the power electronics industry, as they can be realized at a very low cost and easily combined to form more complex circuits.

Power packaged electronic devices typically generate large amounts of heat during device operation due to the large voltages applied to these devices and/or the large currents that flow through the semiconductor die, bond wires and leads. In order to prevent this heat from damaging the device, the semiconductor die are typically attached to a metal submount that acts as a heat sink for venting the heat from the package. For example, aluminum blocks are commonly used as submounts, and an upper side of these blocks can be plated with a metal such as nickel or silver that allows the discrete semiconductor device to be attached to the submount.

SUMMARY

Pursuant to some embodiments of the present invention, packaged electronic devices are provided that comprise a power semiconductor die that comprises a first terminal and a second terminal, a lead frame comprising a lower side and an upper side that comprises a die pad region, a first lead and a second lead, a dielectric substrate, and a thermally conductive adhesion layer on an upper side of the dielectric substrate. The power semiconductor die is on the die pad region of the lead frame and the lead frame is on an upper side of the thermally conductive adhesion layer.

In some embodiments, the first lead may be integral with the lead frame and electrically connected to the first terminal of the power semiconductor die through the lead frame. In some embodiments, the dielectric substrate may comprise a ceramic substrate and the thermally conductive adhesion layer comprises a metal braze layer. The metal braze layer may, for example, be directly attached to the ceramic substrate and to the lower side of the lead frame.

In some embodiments, the second lead may not be electrically connected to the die pad region and may be electrically connected to the second terminal of the power semiconductor die. For example, the second lead may be electrically connected to the second terminal of the power semiconductor die via a bond wire.

In some embodiments, the packaged electronic device may further comprise an overmold package that encapsulates an upper side and side surfaces of the power semiconductor die and/or a lower metal cladding layer on a lower side of the dielectric substrate. The lead frame and the lower metal cladding layer may, in some embodiments, be formed of the same metal. The metal braze layer may be a first metal braze layer, and a second metal braze layer may be provided between an upper side of the lower metal cladding layer and the lower side of the dielectric substrate.

In some embodiments, the first lead and the die pad region may be part of a monolithic lead frame structure.

In some embodiments, the packaged electronic device may further comprise an upper metal cladding layer on an upper side of the metal braze layer and a substrate attach metal layer that is interposed between the upper metal cladding layer and the lead frame.

Pursuant to further embodiments of the present invention, packaged electronic devices are provided that comprise a dielectric substrate, a first metal cladding layer on a lower side of the dielectric substrate, a lead frame that has an upper side that comprises a die pad region and a lower side that is on the upper side of the dielectric substrate, and a power semiconductor die that is on the die pad region of the lead frame.

In some embodiments, the packaged electronic device may further comprise an overmold encapsulation that encapsulates an upper side and side surfaces of the power semiconductor die and at least an upper side of the dielectric substrate, a first metal braze layer between the first metal cladding layer and the ceramic substrate, and/or a second metal braze layer on the upper side of the ceramic substrate. In some embodiments, a second metal cladding layer may be provided on an upper side of the second metal braze layer, and the lead frame is mounted on an upper side of the second metal cladding layer by a substrate attach metal layer. In some embodiments, the second metal braze layer may be directly attached to both the upper side of the ceramic substrate and to the lower side of the lead frame.

In some embodiments, the dielectric substrate may be a ceramic substrate. In some embodiments, the lead frame may further comprise a first lead that is integral with and electrically connected to the die pad region. In some embodiments, the packaged electronic device may also comprise a second lead that is electrically connected to a terminal of the power semiconductor die via a bond wire.

Pursuant to still further embodiments of the present invention, packaged electronic devices are provided that comprise a dielectric substrate, a first metal cladding layer on a lower side of the dielectric substrate, a power semiconductor die that is mounted on an upper side of the dielectric substrate, an overmold encapsulation that surrounds an upper side and side surfaces of the power semiconductor die and at least partially surrounds sidewalls of the dielectric substrate while exposing at least a portion of the first metal cladding layer, and a first lead and a second lead that each extend through the overmold encapsulation and that are electrically connected to the power semiconductor die. The power semiconductor die is electrically isolated from the first metal cladding layer.

In some embodiments, the power substrate may be a ceramic substrate and a first metal braze layer may be on an upper side of the ceramic substrate.

In some embodiments, the packaged electronic device further comprises a lead frame that comprises an upper side comprising a die pad region. A lower side of the lead frame may be mounted on an upper side of the first metal braze layer and the power semiconductor die may be mounted on the die pad region. In some embodiments, the first metal braze layer may be directly attached to the ceramic substrate and to the lower side of the lead frame.

In some embodiments, the first lead may be integral with the lead frame and may be electrically connected to a first terminal of the power semiconductor die.

In some embodiments, the second lead may not be electrically connected to the die pad region and may be electrically connected to the second terminal of the power semiconductor die via a bond wire.

In some embodiments, the first metal cladding layer is mounted on the lower side of the ceramic substrate via a second metal braze layer.

In some embodiments, the device may further comprise an upper metal cladding layer on an upper side of the first metal braze layer and a substrate attach metal layer that is interposed between the upper metal cladding layer and the lead frame.

Figure 1:
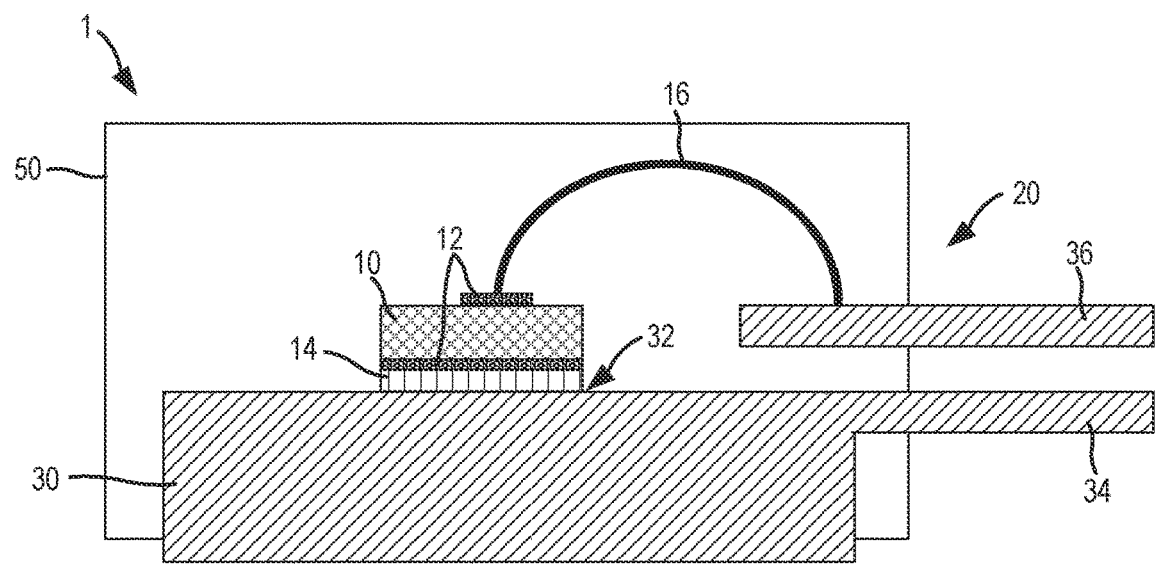
FIG. 1 is a schematic cross-sectional view of a conventional packaged discrete electronic device.

Note that when multiple like elements are shown in the figures they may be identified using two-part reference numerals. Such elements may be referred to herein individually by their full reference numeral (e.g., terminal 12-1) and may be referred to collectively by the first part of their reference numeral (e.g., the terminals 12).

DETAILED DESCRIPTION

Packaged discrete electronic devices are typically mounted on printed circuit boards of larger electronic systems. Herein, these printed circuit boards may be referred to as customer motherboards. A packaged discrete electronic device is typically mounted on a heat sink on the customer motherboard so that heat vented through the primary thermal interface of the packaged discrete electronic device may also be vented away from the customer motherboard. The primary thermal interface of a packaged electronic device refers to the primary path for dissipating heat from within the packaged electronic device. Typically, the heat sink on the customer motherboard is implemented as a metal (e.g., copper or aluminum) pad or block. The heat sink on the customer motherboard is often electrically active (i.e., has a non-zero voltage).

Most conventional packaged discrete electronic devices do not electrically isolate the power semiconductor die from the primary thermal interface of the package. Instead, a thermally conductive but electrically isolating material such as, for example, a thin dielectric layer (e.g., a silicone layer) is interposed between the packaged discrete electronic device and the heat sink on the customer motherboard. This thin dielectric layer may be referred to herein as a "thermal pad." The thermal pad electrically isolates the primary thermal interface between the package (and hence the power semiconductor die) and the customer motherboard from the electronic circuits on the customer motherboard. Electrically isolating the packaged semiconductor device from the customer motherboard using such a thermal pad is acceptable and convenient for packaged electronic devices that operate at lower voltage (e.g., tens of volts) and current levels. However, as electronic devices are introduced that are designed to block thousands or tens of thousands of volts, the capacitive coupling across the thermal pad may be strong enough to negatively impact the performance of the packaged discrete electronic device and/or may degrade the material of the thermal pad, which may result in a short circuit between the primary thermal interface and the metal pad on the customer motherboard. Such a short circuit will typically render the packaged discrete electronic device inoperable, and may also damage or even destroy the device.

Pursuant to embodiments of the present invention, packaged electronic devices are provided that each include a power semiconductor die that is electrically isolated from the primary thermal interface of the device. The packaged electronic devices disclosed herein may exhibit improved reliability and/or current carrying capacity (rating) as compared to conventional solutions, and may do so at little or no additional cost, and possibly at lower cost when used in a mass-production manufacturing environment.

Pursuant to some embodiments of the present invention, packaged electronic devices are provided that include a dielectric (e.g., ceramic) substrate that has a metal braze layer on an upper side thereof. This metal braze layer may be directly attached to a main body of a lead frame that includes an integrated lead. The dielectric substrate conducts heat well, and may provide excellent voltage isolation (it is capable of isolating tens of thousands of volts). Moreover, the dielectric substrate with a brazed metal layer thereon may exhibit excellent thermo-mechanical reliability.

In some embodiments, a packaged electronic device is provided that includes a lead frame that has a die pad region on an upper side thereof and a power semiconductor die that has at least a first terminal and a second terminal mounted on the die pad region of the lead frame. Herein a "terminal" of a power semiconductor die refers to a conductive (e.g., metal) structure on the die through which electrical signals may be input to the die and/or output from the die. The terminal may comprise, for example, a conductive pad, block, contact or the like. The device also includes a plurality of leads, where a first of these leads is integral with the lead frame and electrically connected to the first terminal of the power semiconductor die through the lead frame. The device further includes a dielectric substrate having a thermally conductive adhesion layer such as a metal braze layer on an upper side of the dielectric substrate. The lead frame is mounted on an upper side of the metal braze layer.

In other embodiments, packaged electronic devices are provided that include a dielectric substrate, a first metal cladding layer on a lower side of the dielectric substrate, a lead frame that has an upper side that includes a die pad region and a lower side that is mounted on an upper side of the dielectric substrate, and a power semiconductor die that is mounted on the die pad region of the lead frame.

In still other embodiments, packaged electronic devices are provided that include a dielectric substrate that has a first metal cladding layer on a lower side thereof, a power semiconductor die that is mounted on the power substrate, an overmold encapsulation that surrounds upper and side surfaces of the power semiconductor die and at least partially surrounds sidewalls of the dielectric substrate while exposing at least a portion of the first metal cladding layer and a plurality of leads that extend through the overmold encapsulation and that are electrically connected to the power semiconductor die. In these devices, the power semiconductor die is electrically isolated from the first metal cladding layer.

In all of the above-described embodiments, the dielectric substrate may be a ceramic substrate. In some embodiments, the metal braze layer may be directly attached to both the upper side of the ceramic substrate and to the lower side of the lead frame. The devices may include both integrated leads that are part of the monolithic lead frame structure as well as floating leads that are not attached to the lead frame or electrically connected to the die pad region of the lead frame (although they may be connected to the lead frame through the power semiconductor die). These floating leads may be directly connected to terminals of the power semiconductor die or may be connected to terminals of the power semiconductor die through bond wires. An overmold package may encapsulate an upper side and side surfaces of the power semiconductor die and an upper side and at least part of the side surfaces of the dielectric substrate.

In some embodiments, the dielectric substrate may further include an upper metal cladding layer on an upper side of the metal braze layer and a substrate attach metal layer that is interposed between the upper metal cladding layer and the lead frame.

Embodiments of the present invention will now be discussed in further detail with reference to the attached figures. It will be appreciated that features of the different embodiments disclosed herein may be combined in any way to provide many additional embodiments. Thus, it will be appreciated that various features of the present invention are described below with respect to specific examples, but that these features may be added to other embodiments and/or used in place of example features of other embodiments to provide many additional embodiments. Thus, the present invention should be understood to encompass these different combinations. Additionally, while the example embodiments focus on MOSFET implementations, it will be appreciated that the same techniques may be used in other packaged electronic devices such as insulated gate bipolar transistors (IGBTs), Schottky diodes, gate-controlled thyristors and the like.

FIG. 1 is a schematic cross-sectional view of a conventional, state-of-the-art packaged discrete electronic device 1. As shown in FIG. 1, the packaged device 1 includes a power semiconductor die 10, a submount in the form of a lead frame 30 with one or more integrated leads 34, one or more floating leads 36, and an overmold encapsulation 50. The lead frame 30, leads 34, 36 and the overmold encapsulation 50 together form a package 20 for the power semiconductor die 10. The lead frame 30 includes a die attach region 32 and one or more integrated leads 34. The floating leads 36 may initially be integral with the lead frame 30, but may be separated from the lead frame 30 during the fabrication process and may be held in place by the overmold encapsulation 50. The power semiconductor die 10 is bonded (e.g., soldered) to the die attach region 32 on the upper side of the lead frame 30 using a die attach material 14. The power semiconductor die 10 may include a plurality of terminals 12. For example, a power MOSFET may include a gate terminal, a source terminal and a drain terminal. These terminals 12 are typically located on the upper and/or lower side of the power semiconductor die 10 and may comprise, for example, exposed metal pads. A terminal 12 (e.g., a source terminal of a power MOSFET) is provided on the lower side of the power semiconductor die 10 and is electrically connected to the integrated lead 34 through the die attach material 14 and the lead frame 30. One or more bond wires 16 connect the terminal(s) 12 on the upper side of the power semiconductor die 10 to the floating leads 36. Each terminal 12 may be connected to a single floating lead 36 or to multipole floating leads 36. The insulating encapsulant 50 may comprise an overmold encapsulation that is formed to cover an upper side and side surfaces of the power semiconductor die 10 and at least a portion of the lead frame 30.

The packaged discrete electronic device 1 is typically mounted on a customer motherboard. As discussed above, the packaged discrete electronic device 1 will typically be mounted on a metal pad on the customer motherboard and a thermal pad such as a silicone layer will be interposed between the metal pad on the customer motherboard and the lower side of the lead frame 30 in order to electrically isolate the power semiconductor die 10 from the customer motherboard. The leads 34, 36 may be connected to other pads, die or the like on the customer motherboard.

Figure 2:
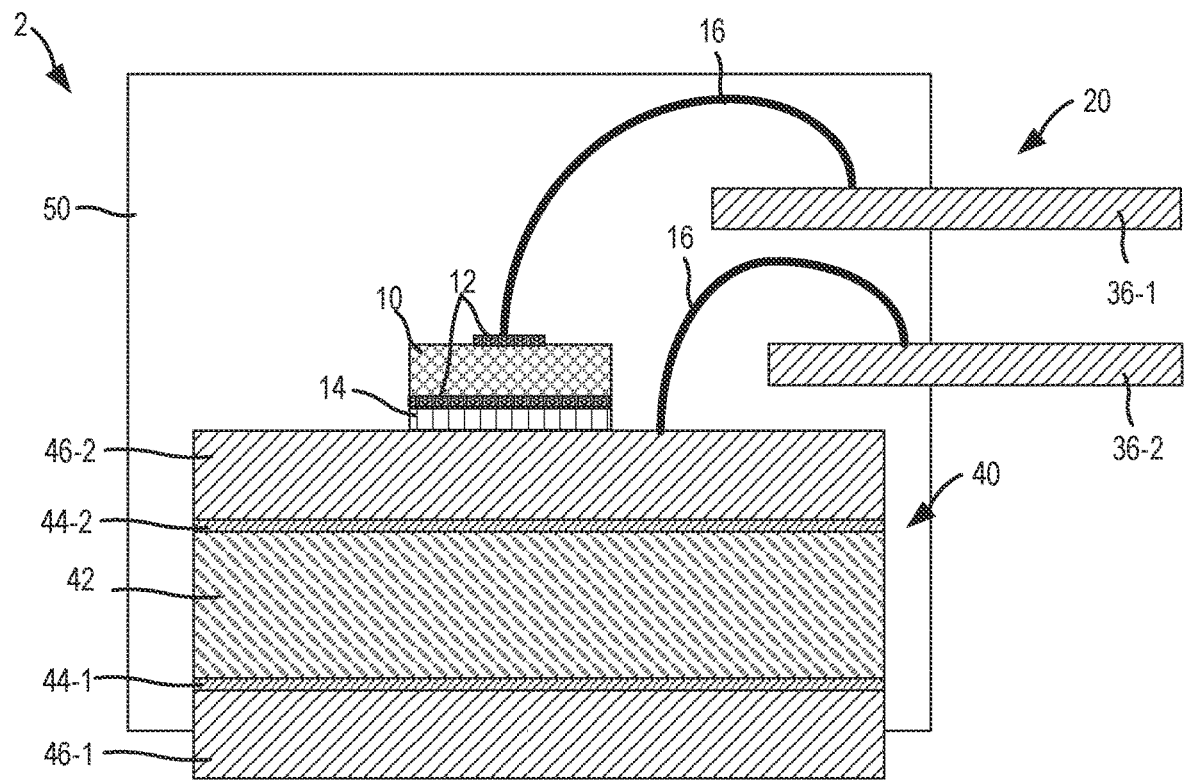
FIG. 2 is a schematic cross-sectional view of another conventional packaged electronic device.

FIG. 2 is a schematic cross-sectional view of a conventional packaged discrete electronic device 2. The conventional packaged discrete electronic device 2 includes a power semiconductor die 10, a submount in the form of a power substrate 40, and an overmold encapsulation 50. As used herein, the term "power substrate" refers to a dielectric substrate that has a metal cladding layer on both sides thereof. The leads 36, power substrate 40 and overmold encapsulation 50 together form a package 20 for the power semiconductor die 10. The leads 36 comprise floating leads that may be held in place by the overmold encapsulation 50.

The power substrate 40 includes a ceramic substrate 42. A lower metal cladding layer 46-1 is formed on the lower side of the ceramic substrate 42, and an upper metal cladding layer 46-2 is formed on the upper side of the ceramic substrate 42. There are two primary types of power substrates. The first type is known as an Active Metal Brazed ("AMB") power substrate, which includes first and second metal braze layers 44-1, 44-2 that are used to bond the first and second metal cladding layers 46-1, 46-2, respectively, to the ceramic substrate 42. Soldering cannot be used to bond metals to dielectric surfaces, but brazing can. The metal braze material has some similarities to solder, but the bonding process is performed at higher temperatures and most typically in a vacuum. The resulting bond is very high in reliability as compared to conventional solder attachment. The second type of power substrate is referred to as a Direct Bonded Substrate (or, more typically, a Direct Bonded Copper or "DBC" power substrate, as the metal cladding layers 46-1, 46-2 are typically copper layers). DBC power substrates are formed by pressing the metal cladding layers 46-1, 46-2 directly against the dielectric substrate 42 while being heat treated in a controlled atmosphere. DBC power substrates are not nearly as reliable as AMB power substrates.

The power semiconductor die 10 is bonded (e.g., soldered) to the upper side of the second metal cladding layer 46-2 using a die attach material 14. A first terminal 12 of the power semiconductor die 10 is located on the top side thereof and is electrically connected to a first floating lead 36-1 via a first bond wire 16. A second terminal 12 of the power semiconductor die 10 is provided on the lower side thereof and is electrically connected to a second floating lead 36-2 through the die attach material 14 and the upper metal cladding layer 46-2. Note that multiple bond wires 36 may be attached between terminal 12 and/or upper metal cladding layer 46-2 and the respective floating leads 36-1, 36-2. Likewise, multiple floating leads 36-1 and/or 36-2 may be provided that are each connected by bonding wires 16 to terminal 12 or upper metal cladding layer 46-2, respectively. The overmold encapsulation 50 covers an upper side and side surfaces of the power semiconductor die 10 and much of the power substrate 40. The power substrate 40 serves as the primary thermal interface for dissipating heat that is generated in the power semiconductor die 10 from the device package 20. The ceramic substrate 42, which is part of this primary thermal interface, electrically isolates the power semiconductor die 10 from a customer motherboard that the packaged electronic device 2 may be mounted on (not shown).

Figure 3:
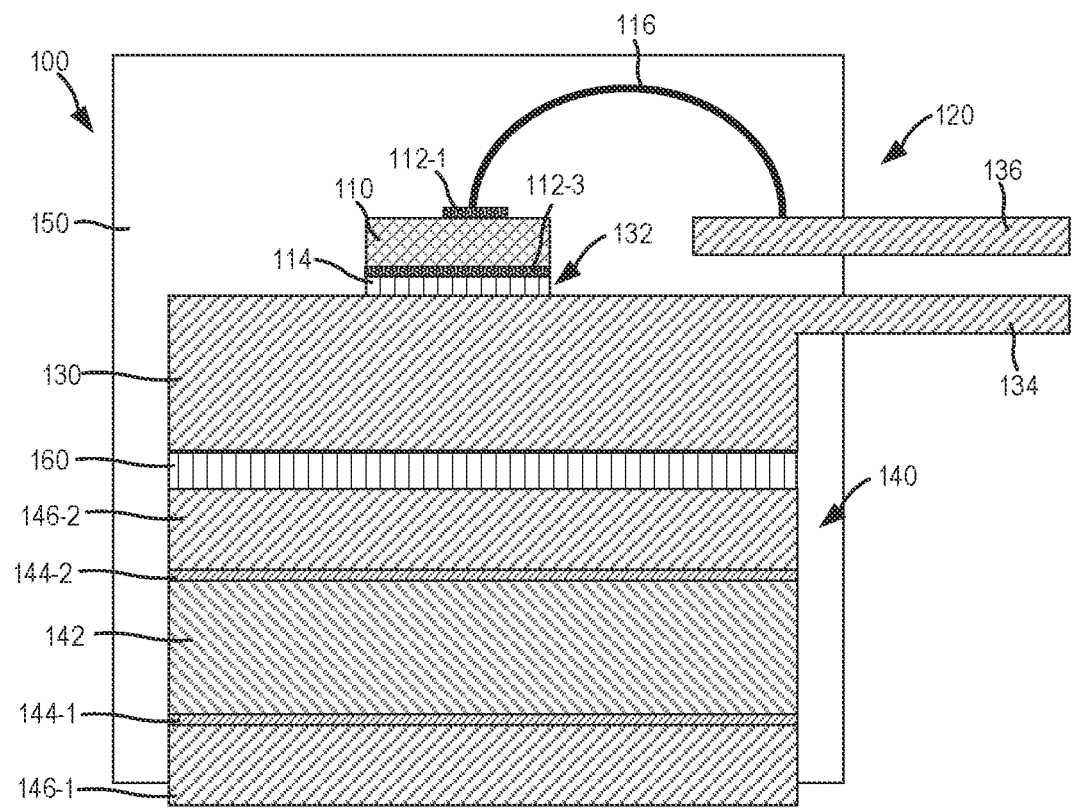
FIG. 3 is a schematic cross-sectional view of a packaged electronic device according to embodiments of the present invention.
Figure 4:
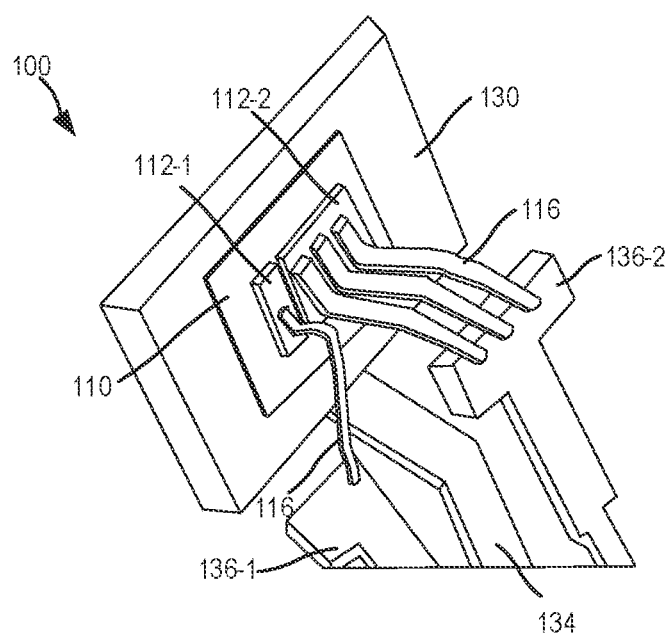
FIG. 4 is a schematic perspective view of the packaged electronic device of FIG. 3 before the overmold encapsulation is applied.

FIG. 3 is a schematic cross-sectional view of a packaged electronic device 100 according to embodiments of the present invention. FIG. 4 is a schematic perspective view of the packaged electronic device 100 of FIG. 3 before an insulating encapsulation is applied. Referring to FIGS. 3 and 4, the packaged electronic device 100 includes a power semiconductor die 110, a submount in the form of a lead frame 130 with integrated leads 134, floating leads 136, a power substrate 140, and an insulating encapsulant 150. The lead frame 130, leads 134, 136, the power substrate 140, and the insulating encapsulant 150 together form a package 120 for the power semiconductor die 110. The lead frame 130 includes a die attach region 132 and one or more integrated leads 134. The floating leads 136 may initially be integral with the lead frame 130, but may be separated from the lead frame 130 during the fabrication process and may be held in place by the insulating encapsulant 150. The power semiconductor die 110 is bonded (e.g., soldered) to the die attach region 132 on the upper side of the lead frame 130 using a die attach material 114.

The power semiconductor die 110 may be a semiconductor device that is designed to block high voltage levels (e.g., hundreds of volts or more) and/or to carry large currents. The power semiconductor die 110 may be formed using wide bandgap semiconductor materials such as silicon carbide and/or gallium nitride-based and/or aluminum nitride-based semiconductor systems (e.g., GaN, AlGaN, InGaN, AlN, etc.). Other wideband gap materials may be used such as devices formed in other Group III-V semiconductor systems or in Group II-VI semiconductor systems. The power semiconductor die 110 may comprise, for example, a MOSFET, a MISFET, an IGBT, a Schottky diode, a gate-controlled thyristor, etc. The power semiconductor die 110 may have a vertical structure in which the upper side of the die includes at least one terminal and the lower side of the die also includes at least one terminal. For example, the device may comprise a vertical MOSFET that has a vertically extending drift region through which current flows during on-state operation.

The power semiconductor die 110 includes a plurality of terminals 112. For example, if the power semiconductor die 110 is a power MOSFET, the power semiconductor die may include three terminals 112. These terminals 112 are typically located on the upper and/or lower side of the power semiconductor die 110 and may comprise, for example, exposed metal pads. In the embodiment of FIGS. 3-4, the device includes three terminals 112, namely gate and drain terminals 112-1, 112-2 that are located on the upper side of the power semiconductor die 110 and a source terminal 112-3 that is located on the lower side of the power semiconductor die 110 (the drain terminal 112-2 is not visible in FIG. 3). One or more bond wires 116 connect the terminals 112-1, 112-2 on the upper side of the power semiconductor die 110 to the respective floating leads 136-1, 136-2. Note that multiple floating leads 136-1 and/or 136-2 may be provided, and bond wires 116 may extend between the multiple floating leads 136-1 or 136-2 and the respective 112-1 or 112-2, respectively. The source terminal 112-3 is electrically connected to the integrated lead 134 through the die attach material 114 and the lead frame 130. The insulating encapsulant 150 may comprise an overmold encapsulation that is formed to cover the upper side and side surfaces of the power semiconductor die 110 and the lead frame 130, and at least a portion of the power substrate 140. It will be appreciated, however, that embodiments of the present invention are not limited thereto. For example, in other embodiments the insulating encapsulation may comprise a silicone gel or another compound. The insulating encapsulation 150 may hold the floating leads 136 in their proper location.

The power substrate 140 includes a dielectric substrate 142, first and second metal braze layers 144-1, 144-2, and lower and upper metal cladding layers 146-1, 146-2. The dielectric substrate 142 may comprise any insulating substrate. The dielectric substrate 142 may comprise a ceramic substrate in some embodiments. In example embodiments, the dielectric substrate 142 may be formed of aluminum oxide (alumina), aluminum nitride, or silicon nitride. A thickness of the dielectric substrate 142 may be selected based on the voltage blocking capability of the packaged electronic device 100 (to ensure sufficient electrical isolation) and material cost considerations. For example, assuming that the dielectric substrate 142 is formed of alumina, the thickness may be in the range of 0.2 mm for a packaged electronic device 100 with a blocking voltage rating of 800 volts, while the thickness may be in the range of 0.5-1.0 mm for a packaged electronic device 100 with a blocking voltage rating of 10,000 volts.

The first metal braze layer 144-1 is formed on the lower side of the dielectric substrate 142, and is used to bond the lower metal cladding layer 146-1 to the dielectric substrate 142. Similarly, the second metal braze layer 144-2 is formed on the upper side of the dielectric substrate 142, and is used to bond the upper metal cladding layer 146-2 to the dielectric substrate 142. The first and second metal braze layers 144-1, 144-2 may comprise, for example, metal alloys that include two or more metals such as copper, silver, nickel, gold, etc. The first and second metal braze layers 144-1, 144-2 may be thin layers (e.g., they may have thicknesses between 1-10 microns). The first and second metal cladding layers 146-1, 146-2 may comprise plated metal layers that include metals such as copper or aluminum (or other appropriate metals). The first and second metal cladding layers 146-1, 146-2 may be thicker or thinner than the dielectric substrate 142, since the thickness of the dielectric substrate 142 will typically vary based on the voltage rating of the device (since the higher the voltage rating, the thicker the dielectric substrate 142 needs to be to achieve a given level of electrical isolation). In some embodiments, the lead frame 130 and the metal cladding layers 146 may be formed of the same metal or metal alloy, but embodiments of the present invention are not limited thereto. Each metal cladding layer 146 may be bonded to the ceramic substrate 142 by depositing the respective metal braze layer 144 on the ceramic substrate 142 and then depositing the metal cladding layer on the metal braze layer 144 and curing the power substrate 140 at an elevated temperature of, for example, 500-1000° C. for a suitable period of time.

The lower side of the lead frame 130 is bonded (e.g., soldered) to the upper side of the power substrate 140 via a substrate attach material 160. The substrate attach material 160 may comprise, for example, solders and sintering materials. The upper metal cladding layer 146-2 facilitates bonding the power substrate 140 to the lead frame 130 via the substrate attach material 160. The thicknesses of the upper metal cladding layer 146-2 may vary based on the current rating of the device. The lower metal cladding layer 146-1 facilitates bonding the power substrate 140 to a metal pad on a customer motherboard (not shown).

The power substrate 140 serves as highly thermally conductive path that acts as the primary thermal interface for dissipating heat that is generated in the power semiconductor die 110 from the packaged electronic device 100. The dielectric substrate 142, which is typically a ceramic substrate, electrically isolates the power semiconductor die 110 from a customer motherboard (not shown) that the packaged electronic device 100 may be mounted on. Thus, the packaged electronic device 100 provides electrical isolation that is not provided by the conventional packaged electronic device 1 of FIG. 1 and may be bonded to the customer motherboard without the need for any thermal pad such as a silicone pad. Since the lead frame 130 is electrically isolated from the customer motherboard, the packaged electronic device 100 may include integrated leads 134. As discussed above, integrated leads cannot be used in cases where the conventional packaged electronic device 1 of FIG. 1 is a high-power device, since the thermal pad on the customer motherboard will typically not provide sufficient electrical isolation. The provision of integrated leads 134 avoids the need to use bond wire connections 116 to electrically connect terminals on the lower side of the power semiconductor die 110 to leads of the device as is required in the conventional packaged electronic device 2 of FIG. 2. Moreover, eliminating integrated leads 134 will typically require retooling of existing production lines, which may be cost prohibitive.

Figure 5:
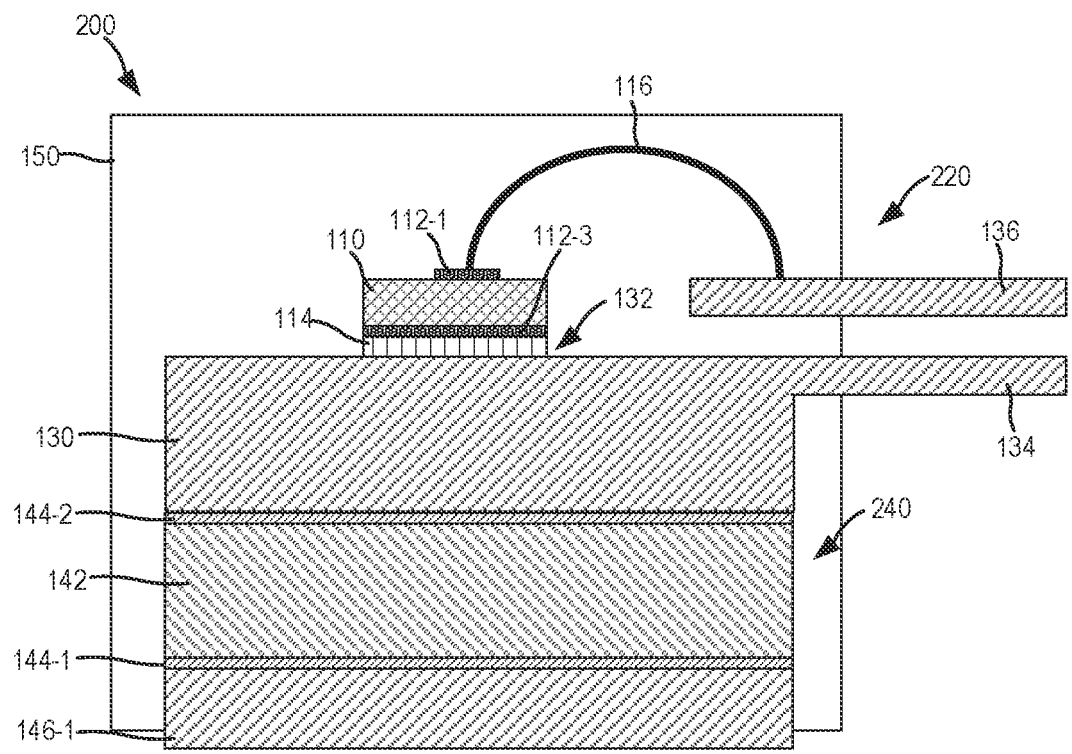
FIG. 5 is a schematic cross-sectional view of a packaged electronic device according to further embodiments of the present invention.
Figure 6:
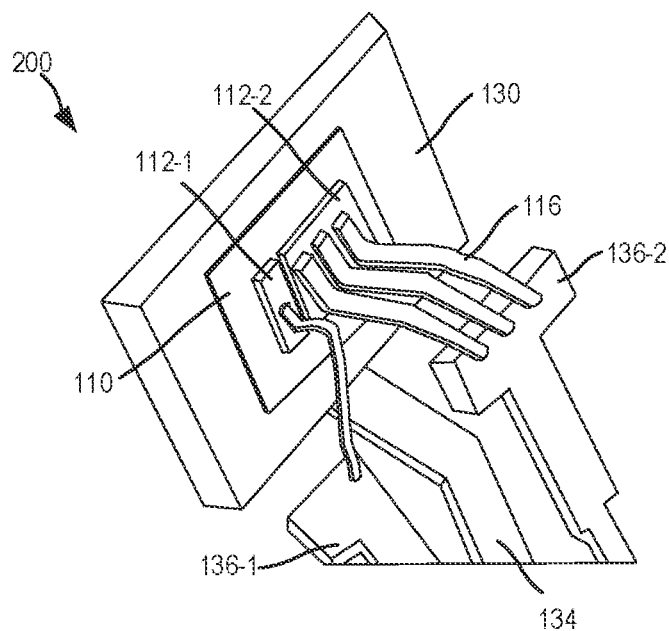
FIG. 6 is a schematic perspective view of the packaged electronic device of FIG. 5 before the overmold encapsulation is applied.

FIG. 5 is a schematic cross-sectional view of a packaged electronic device 200 according to further embodiments of the present invention. FIG. 6 is a schematic perspective view of the packaged electronic device 200 of FIG. 5 before an overmold encapsulation is applied.

Referring to FIGS. 5 and 6, it can be seen that the packaged electronic device 200 is similar to the packaged discrete electronic device 100 that is discussed above with reference to FIGS. 3 and 4. Elements of packaged electronic device 200 that are identical or substantially identical to corresponding elements of packaged electronic device 100 therefore are labelled using the same reference numerals as are used in FIGS. 3-4, and further description of these like elements will therefore generally be omitted.

As can be seen, the primary differences between packaged electronic device 200 and packaged electronic device 100 are that (1) the power substrate 240 of packaged electronic device 200 is replaced in packaged electronic device 200 with a substrate structure 240 that does not include an upper metal cladding layer (i.e., upper metal cladding layer 146-2 of packaged electronic device 100 is omitted) and (2) packaged electronic device 200 does not include the substrate attach material 160. Thus, in packaged electronic device 200, the lead frame 130 is bonded to the substrate structure 240 via the second metal braze layer 144-2. This arrangement reduces the number of layers in the primary thermal path as the upper metal cladding layer 146-2 and the substrate attach material 160 are omitted. Consequently, the thermal resistance of the heat dissipation path between the packaged electronic device 200 and the heat sink on the customer board may be reduced, resulting in increased heat transfer. This may allow the device to handle higher current levels and/or improve device reliability. Additionally, omitting the two layers reduces material cost and potentially simplifies device fabrication.

The packaged electronic device 200 may also have several additional advantages over the packaged electronic device 100 that is discussed above.

First, one potential point of failure in packaged electronic devices (such as packaged electronic device 100) that are adhered to a submount using a substrate attach material is that the substrate attach material may not form a strong bond between the submount and the lead frame. The brazed connection between the ceramic substrate 142 and the lead frame 130 provided in packaged electronic device 200 may be a more reliable connection, and thus packaged electronic device 200 may be less susceptible to failure.

Second, it may be important that the lead frame 130 is mounted on the submount structure (here substrate structure 240) without being slanted (i.e., planes defined by the attachment surfaces of the substrate structure 240 and lead frame 130 should be parallel to each other). In practice, it may be difficult to ensure that this is the case when the lead frame 130 is mounted to a power substrate 140 using a substrate attach material 160, and hence the thickness of the substrate attach material 160 must be carefully controlled and other steps may need to be taken to ensure that distance between the mating surfaces of the power substrate 140 and the lead frame 130 are kept highly uniform. When the substrate structure 240 is brazed to the lead frame 130, the distance between the substrate structure 240 and lead frame 130 may be kept uniform, eliminating the need for the special process steps that are required when the power substrate 140 and lead frame 130 are bonded together using a substrate attach material 160.

Third, the substrate attach process step used in forming packaged electronic device 100 of FIGS. 3-4 includes a reflow step in which the device 100 is heated in order to melt the substrate attach material 160 to bond the lead frame 130 to the power substrate 140. This step is not necessary in the fabrication of the packaged electronic device 200, and hence may facilitate faster cycle time in mass production manufacturing. Moreover, there may be only one soldering step in the fabrication of power semiconductor 200, namely the die attach step that is used to mount the power semiconductor die 110 to the lead frame 130, since the substrate attach step included in the fabrication process of packaged electronic device 100 is omitted. In manufacturing packaged electronic device 100 it may be necessary to use a die attach material 114 with a high melting point to ensure that the die attach material 114 does not reflow during the subsequent substrate attach soldering step (the substrate attach material may be selected to have a lower melting point). Since the substrate attach soldering step may be omitted in fabricating packaged electronic device 200, a wider selection of die attach materials 114 may be used, which may allow for the use of materials that reduce cost and/or exhibit improved reliability.

Figure 7:
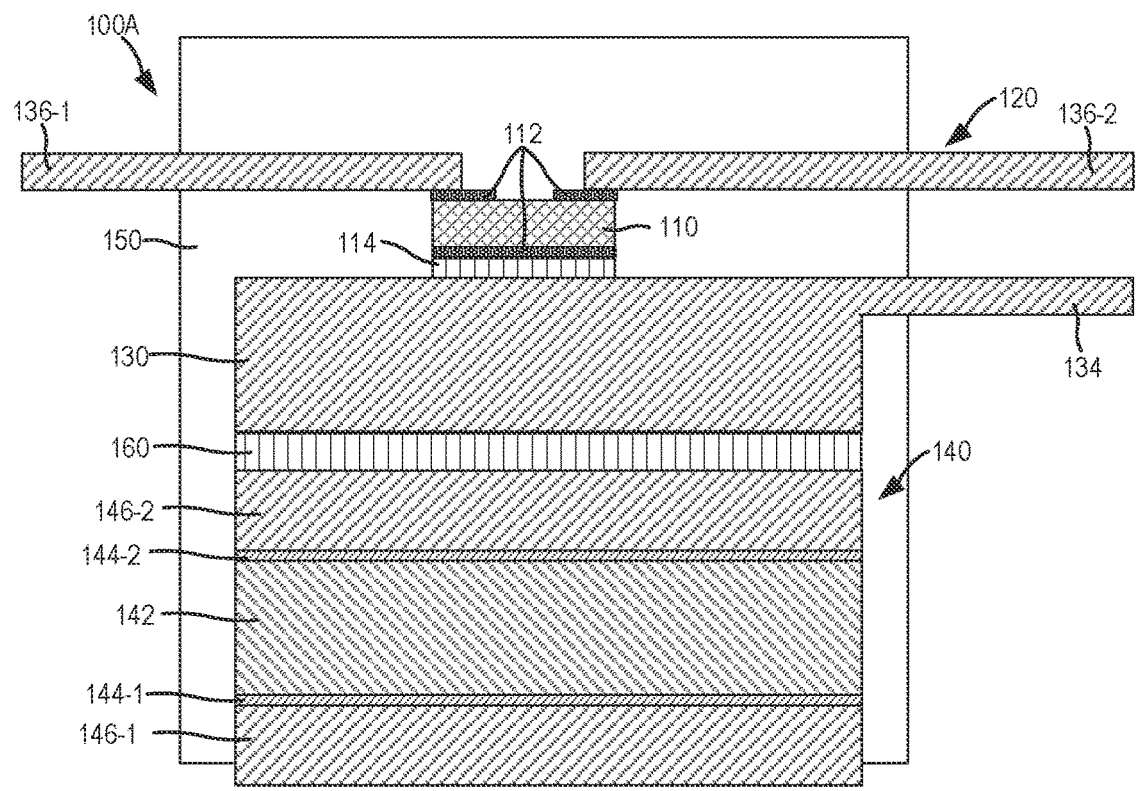
FIG. 7 is a schematic cross-sectional view of a modified version of the packaged electronic device of FIGS. 3-4.

FIG. 7 is a schematic cross-sectional view of a packaged electronic device 100A that is a modified version of the packaged electronic device 100 of FIGS. 3-4. As can be seen by comparing FIGS. 3 and 7, the packaged electronic device 100A is identical to the packaged semiconductor device 100 except that the bond wires 116 are omitted in packaged semiconductor device 100A, as the floating leads 136 are directly bonded to the terminals 112 on the upper side of the power semiconductor die 110. In packaged electronic device 100A, the gate and drain terminals 112-1, 112-2 are located on opposed sides of the upper surface of semiconductor die 110 and the floating leads 136-1, 136-2 are likewise on opposed sides of the device 100A. In other embodiments, all three leads 134, 136-1, 136-2 may extend from the same side of the device.

Figure 8:
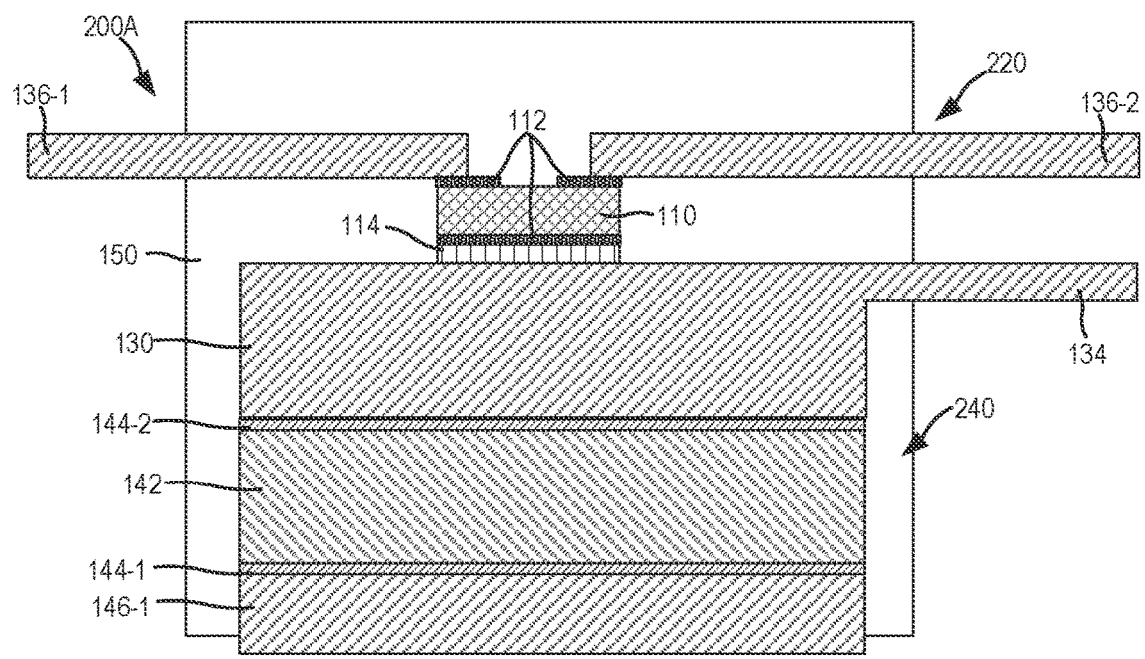
FIG. 8 is a schematic cross-sectional view of a modified version of the packaged electronic device of FIGS. 5-6.

FIG. 8 is a schematic cross-sectional view of a packaged electronic device 200A that is modified version of the packaged electronic device 200 of FIGS. 5-6. Packaged electronic device 200A is a modified version of packaged electronic device 200 that includes the same modifications that packaged electronic device 100A includes as compared to packaged electronic device 100. In particular, packaged electronic device 200A omits the bond wires 116 and instead has the floating leads 136 that are directly bonded to the terminals 112-1, 112-2 on the upper side of the power semiconductor die 110.

Figure 9:
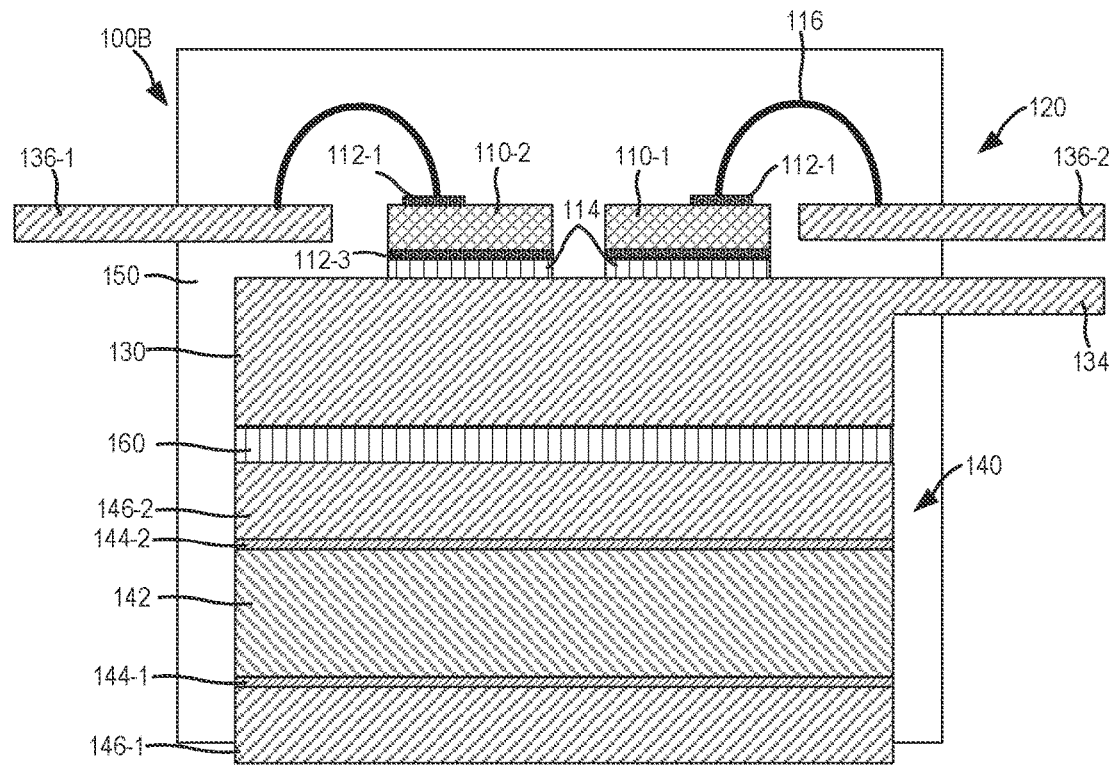
FIG. 9 is a schematic cross-sectional view of another modified version of the packaged semiconductor device of FIGS. 3-4.

FIG. 9 is a schematic cross-sectional view of a packaged electronic device 100B that is another modified version of the packaged electronic device 100 of FIGS. 3-4. As can be seen by comparing FIGS. 3 and 9, the packaged electronic device 100B is identical to the packaged electronic device 100 except that packaged electronic device 100B is not a "discrete" device and instead includes two power semiconductor die 110-1, 110-2. In an example embodiment, the two power semiconductor die 110-1, 110-2 may be power MOSFETs that are electrically connected in parallel. As shown, a pair of floating gate leads 136-1, 136-2 are electrically connected to the gate terminals 112-1 of the power semiconductor die 110 by bond wires 116 (in other embodiments, a single floating gate lead 136 could be provided). The drain terminals (not visible in FIG. 9) of each die 110 may be connected to one or more floating drain leads 136 (also not visible in FIG. 9). The source terminal 112-3 of each power semiconductor die 110 may be on the bottom side of the respective power semiconductor die 110 and may be connected to one or more integrated lead 134 though the lead frame 130.

Figure 10:
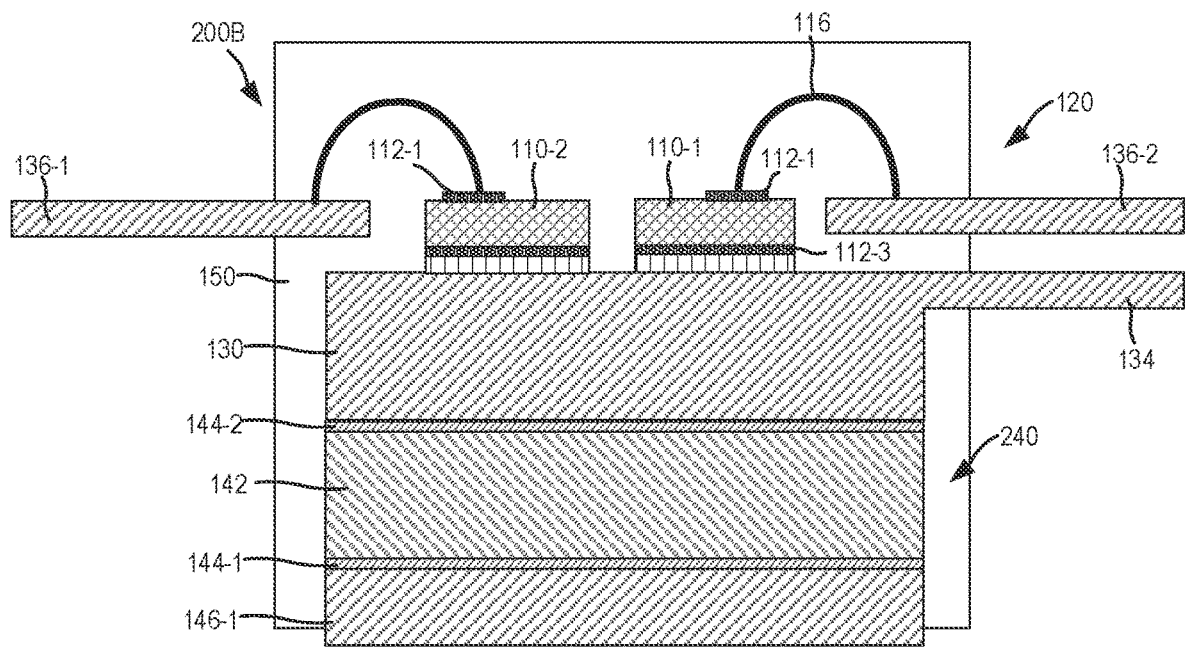
FIG. 10 is a schematic cross-sectional view of another modified version of the packaged electronic device of FIGS. 5-6.

FIG. 10 is a schematic cross-sectional view of a packaged electronic device 200B that is another modified version of the packaged electronic device 200 of FIGS. 5-6. Packaged electronic device 200B is the counterpart of packaged electronic device 100B in that it includes two power semiconductor die 110 as opposed to a single power semiconductor die.

It will be appreciated that when multiple power semiconductor die 110 are included in a packaged electronic device according to embodiments of the present invention, the semiconductor die 110 may the same or different, and may be electrically connected to each other and to the leads 134, 136 of the package in a variety of ways. Thus, in example embodiments, multiple power MOSFETs may be provided that are connected in series or parallel, multiple power Schottky diodes may be provided that are connected in series or parallel, one or more power MOSFETs and one or more power Schottky diodes may be connected in series or parallel, etc.

One potential concern with providing a dielectric substrate 142 in the primary thermal dissipation path is that the dielectric substrate 142 will typically have a different coefficient of thermal expansion as compared to the metal layers in the primary thermal dissipation path. As the packaged electronic devices heat and cool (thermal cycle) during normal operation this may create stresses and strains within the material stack-up, and may weaken the bonds between the different layers of the primary thermal dissipation path. This may reduce the performance of the device or even damage and destroy the device. Thus, the thickness of the metal layers that are formed on either side of the dielectric substrate 142 may be selected so that the metal layers that are above and below the dielectric substrate 142 will expand/contract at similar rates. This may improve the reliability of the device. In another application, the thickness of the metal layers 146 that are formed on either side of the dielectric substrate 142 may be selected to provide a desired flat or convex curvature on the exposed back side of the package. The presence of a flat or convex mounting surface enables more efficient and reliable heat venting when mounted to a heat sink, as compared to a concave back surface.

While embodiments of the present invention have been described above that include dielectric substrates having metal braze layers, it will be appreciated that embodiments of the present invention are not limited thereto. For example, in other embodiments, one or more of the metal braze layers may be replaced with a thermally-conductive adhesive. Such embodiments may have reduced thermo-mechanical reliability as compared to brazed interfaces, but may be sufficient for applications that have reduced temperature cycling (e.g., lower power devices, devices used in climate-controlled environments) and low vibrations (e.g., many non-automotive applications).

Power semiconductor dies have been attached to submounts such as power substrates. These known devices, however, do not include a lead frame having an integral lead that is connected to a terminal of the power semiconductor die.

Figure 11:
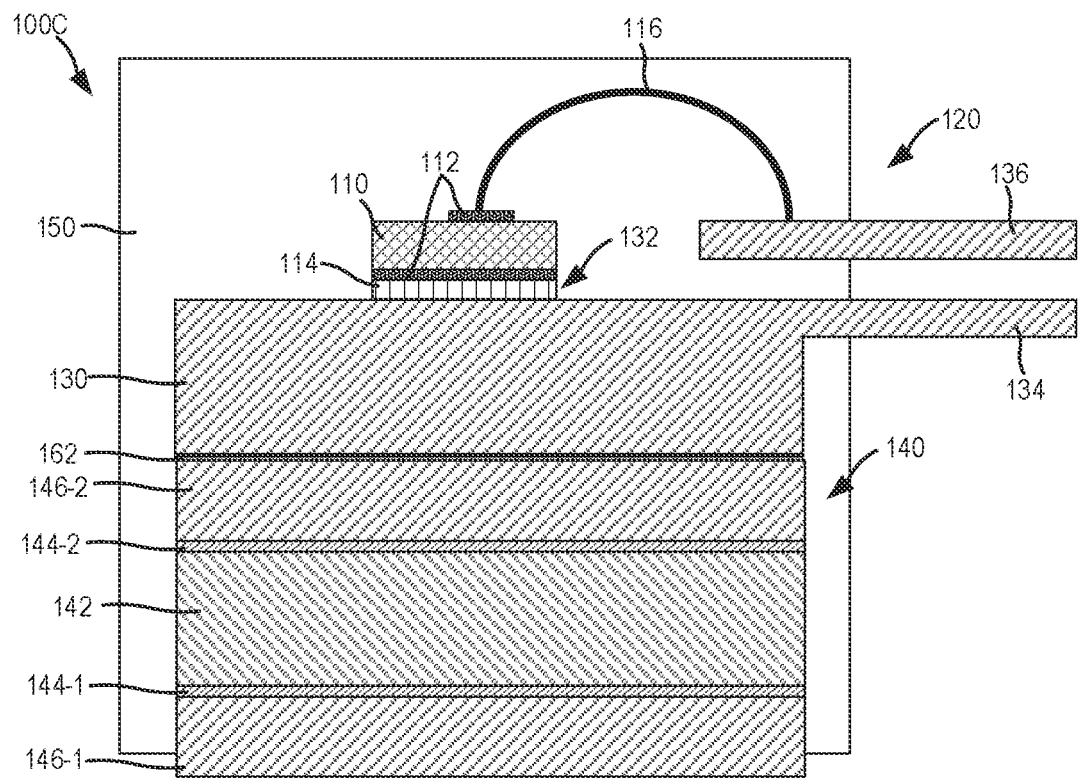
FIG. 11 is a schematic cross-sectional view of another modified version of the packaged electronic device of FIGS. 3-4 that is formed via direct bonding.
Figure 12:
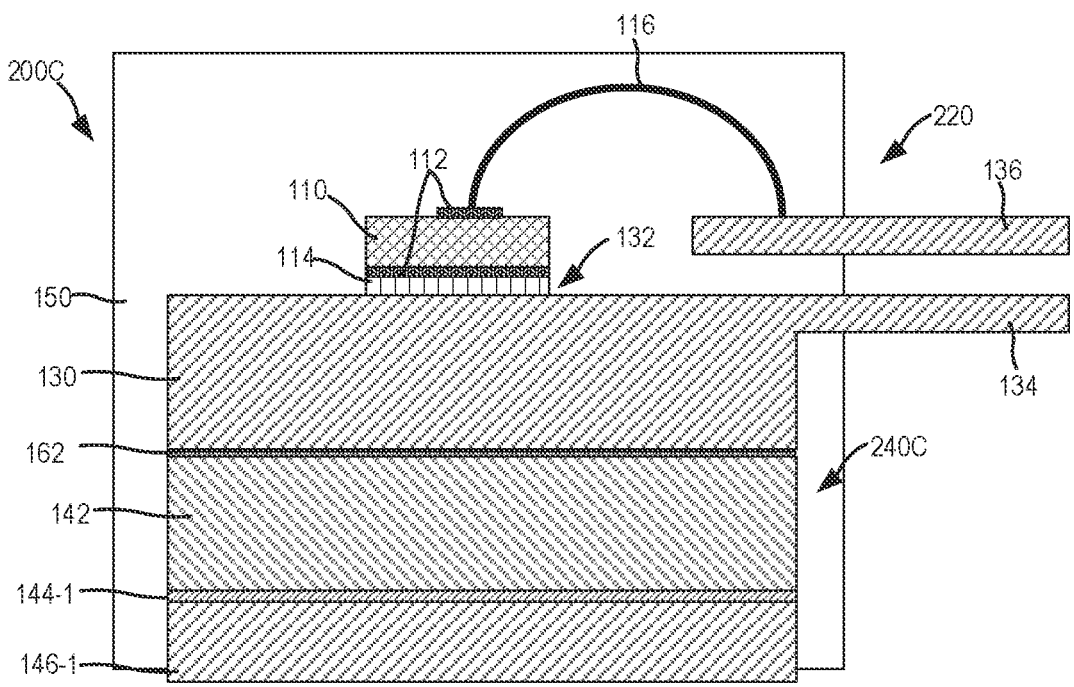
FIG. 12 is a schematic cross-sectional view of another modified version of the packaged electronic device of FIGS. 5-6 that is formed via direct bonding.

Pursuant to further embodiments of the present invention, packaged electronic devices are provided that include one or more power semiconductor dies mounted on a lead frame that is attached to a dielectric substrate using a thermally-conductive adhesive. FIGS. 11 and 12 show modified versions of the packaged electronic devices of FIGS. 3-4 and 5-6, respectively, that have such configurations. As shown in FIG. 11, a packaged electronic device 100C is identical to the packaged semiconductor device 100 except that the substrate attach material layer 160 is replaced with a thermally-conductive adhesive paste 162 (e.g., a ceramic-filled or metal-loaded adhesive paste) so that the lead frame 130 is attached to the power substrate 140 via a direct bonding operation. FIG. 12 is a schematic cross-sectional view of a packaged electronic device 200C that is modified version of the packaged electronic device 200 of FIGS. 5-6. Packaged electronic device 200C is the counterpart of packaged electronic device 100C of FIG. 11, as the second metal braze layer 144-2 is replaced with a thermally-conductive adhesive paste 162. An example of such an adhesive paste may be a ceramic-filled or metal-loaded adhesive paste 162 in the embodiment of FIG. 12 so that the dielectric substrate 142 may be attached to the lead frame 130.

As described above, according to embodiments of the present invention, a lead frame may be bonded to an underlying dielectric substrate using either (1) a metal braze layer or (2) a ceramic or metal filled adhesive paste. Herein, the term thermally conductive adhesion layer refers to a thermally conductive bonding layer between a lead frame and an underlying submount, and encompasses both metal braze layers and ceramic or metal filled adhesive pastes.

While embodiments of the present invention have been discussed above with reference to packaged electronic devices that include a power semiconductor die, it will be appreciated that embodiments of the present invention are not limited thereto. For example, all of the embodiments disclosed herein may include one or more radio frequency ("RF") semiconductor die in place of the power semiconductor die. For example, the semiconductor die included in the packaged electronic devices may comprise high electron mobility transistor ("HEMT") amplifiers that are designed to amplify RF signals.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "attached," "connected," or "coupled" to another element, it can be directly attached, directly connected or directly coupled to the other element or intervening elements may be present. In contrast, when an element is referred to as being "directly attached," "directly connected," or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A packaged electronic device, comprising:
   a power semiconductor die that comprises a first terminal and a second terminal;
   a lead frame comprising a lower side and an upper side that comprises a die pad region;
   a first lead and a second lead;
   a dielectric substrate;

a lower metal cladding layer on a lower side of the dielectric substrate;
a first metal braze layer on an upper side of the dielectric substrate; and
a second metal braze layer is between an upper side of the lower metal cladding layer and the lower side of the dielectric substrate,
wherein the power semiconductor die is on the die pad region of the lead frame and the lead frame is on an upper side of the first metal braze layer, and
wherein the first metal braze layer is directly attached to the dielectric substrate and to the lower side of the lead frame.

2. The packaged electronic device of claim 1, further comprising an overmold package that encapsulates an upper side and side surfaces of the power semiconductor die.

3. The packaged electronic device of claim 1, wherein the lead frame comprises a first type of metal and the lower metal cladding layer also comprises the first type of metal.

4. The packaged electronic device of claim 1, wherein the first lead is integral with the lead frame and electrically connected to the first terminal of the power semiconductor die through the lead frame.

5. The packaged electronic device of claim 4, wherein the second lead is separate from the lead frame and is directly bonded to the second terminal of the power semiconductor die.

6. A packaged electronic device, comprising:
a dielectric substrate;
a first metal cladding layer on a lower side of the dielectric substrate;
a lead frame that has an upper side that comprises a die pad region and a lower side that is on an upper side of the dielectric substrate;
a first power semiconductor die that is on the die pad region of the lead frame;
a first metal braze layer between the first metal cladding layer and the dielectric substrate; and
a second metal braze layer on the upper side of the dielectric substrate, wherein the second metal braze layer is directly attached to both the upper side of the dielectric substrate and to the lower side of the lead frame.

7. The packaged electronic device of claim 6, further comprising an overmold encapsulation that encapsulates an upper side and side surfaces of the first power semiconductor die and at least an upper side of the dielectric substrate.

8. The packaged electronic device of claim 7, wherein the dielectric substrate comprises a ceramic substrate.

9. The packaged electronic device of claim 6, wherein the lead frame further comprises a first lead that is integral with and electrically connected to the die pad region, the packaged electronic device further comprising a second lead that is directly bonded to a first terminal of the first power semiconductor die.

10. The packaged electronic device of claim 6, further comprising a second power semiconductor die that is on the lead frame and electrically connected to the first power semiconductor die.

11. The packaged electronic device of claim 10, wherein the first and second power semiconductor die are electrically connected in parallel.

12. The packaged electronic device of claim 10, wherein a second terminal of the first power semiconductor die is electrically connected to the first lead through the lead frame, and a first terminal of the second power semiconductor die is also electrically connected to the first lead through the lead frame.

13. A packaged electronic device, comprising:
a dielectric substrate;
a first metal braze layer on an upper surface of the dielectric substrate;
a thermally-conductive adhesive paste;
a lead frame on the first metal braze layer;
a first metal cladding layer on a lower side of the dielectric substrate;
a second metal braze layer between the first metal cladding layer and the dielectric substrate;
a power semiconductor die that is mounted on an upper side of the lead frame;
an overmold encapsulation that surrounds an upper side and side surfaces of the power semiconductor die and at least partially surrounds sidewalls of the dielectric substrate while exposing at least a portion of the first metal cladding layer; and
a first lead and a second lead that each extend through the overmold encapsulation and that are electrically connected to the power semiconductor die,
wherein the power semiconductor die is electrically isolated from the first metal cladding layer, and
wherein the first metal braze layer is directly attached to the dielectric substrate and to a second metal cladding layer.

14. The packaged electronic device of claim 13, wherein the dielectric substrate comprises a ceramic substrate.

15. The packaged electronic device of claim 13, wherein the first lead is integral with the lead frame and is electrically connected to a first terminal of the power semiconductor die.

16. The packaged electronic device of claim 15, wherein the second lead is directly bonded to a second terminal of the power semiconductor die.

17. The packaged electronic device of claim 13, wherein a thermally-conductive adhesive paste is between the first metal braze layer and the lead frame.

* * * * *